United States Patent
Wang et al.

(10) Patent No.: US 11,430,518 B1
(45) Date of Patent: Aug. 30, 2022

(54) CONDITIONAL DRIFT CANCELLATION OPERATIONS IN PROGRAMMING MEMORY CELLS TO STORE DATA

(71) Applicant: Micron Technology, Inc., Boise, ID (US)

(72) Inventors: Hongmei Wang, Boise, ID (US); Mingdong Cui, Folsom, CA (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/217,379

(22) Filed: Mar. 30, 2021

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 13/004* (2013.01); *G11C 13/0026* (2013.01); *G11C 13/0028* (2013.01)

(58) Field of Classification Search
CPC ............ G11C 13/0069; G11C 13/0004; G11C 13/0026; G11C 13/0028

USPC ......................................................... 365/163
See application file for complete search history.

(56) References Cited

U.S. PATENT DOCUMENTS

| 2016/0284399 A1* | 9/2016 | Mantegazza ....... G11C 13/0033 |
| 2019/0206506 A1 | 7/2019 | Tortorelli et al. |

\* cited by examiner

*Primary Examiner* — Vu A Le
(74) *Attorney, Agent, or Firm* — Greenberg Traurig

(57) ABSTRACT

A memory device having memory cells, voltage drivers, and a controller configured to determine, based on an attribute of a memory cell, whether to apply a drift cancellation pulse that is in the opposite polarity of a programming pulse configured to place the memory cell in a state to represent a bit of data. If the drift in the state of the memory cell from a previous programming operation to write data into the memory cell is predicted to be insufficient to prevent the selection of the memory cell during the application of the programming pulse, the drift cancellation pulse is skipped. Otherwise, the drift cancellation pulse is applied in the opposite polarity of the programming pulse.

20 Claims, 4 Drawing Sheets

CONDITIONAL DRIFT CANCELLATION OPERATIONS IN PROGRAMMING MEMORY CELLS TO STORE DATA

TECHNICAL FIELD

At least some embodiments disclosed herein relate to programming memory cells to store data in general and more particularly, but not limited to, reduction of energy consumption in programming memory cells.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a selector device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determining whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
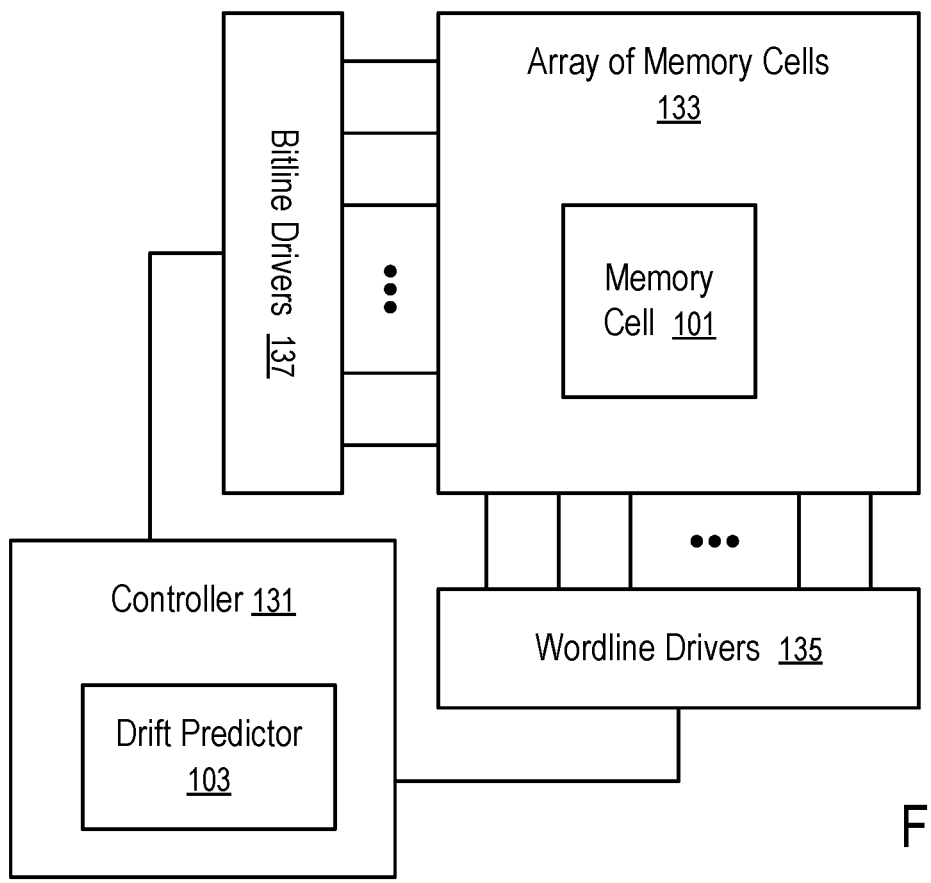
FIG. 1 shows a memory device configured with a drift predictor according to one embodiment.

At least some embodiments disclosed herein provide systems, methods, and apparatus to reduce energy consumption in programming memory cells to store data by selectively skipping drift cancellation operations prior to setting the states of the memory cells according to the data to be stored.

For example, cross point memory of some implementations uses a self-selecting memory cell that has an element (e.g., a sole element) acting both as a selector device and a memory device. For example, the memory cell can use a single piece of alloy with variable threshold capability. The read/write operations of such a memory cell can be based on thresholding the memory cell while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

Such a self-selecting memory cell, having a selector/memory device, can be programmed in cross point memory to have a threshold voltage window. The threshold voltage window can be created by applying programming pulses with opposite polarity to the selector/memory device of the memory cell. For example, the memory cell can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a set cell to snap and thus become conductive while a reset cell remains non-conductive.

Such a memory cell can be configured (programmed, written into, or set) to have a low threshold in a given polarity. When the memory cell has such a state of low threshold during reading at the given polarity (e.g., to represent a state corresponding to storing a bit value of one), it can be referred to as a set cell. Similarly, the memory cell can be configured (programmed, written into, or set) to have a high threshold in the given polarity (e.g., to represent a state corresponding to storing a bit value of zero). When the memory cell has such a state of high threshold during reading at the given polarity, it can be referred to as a reset cell.

After a memory cell is programmed to be a set cell or a reset cell, the state of the memory cell can drift. The threshold of the memory cell may change and move away from the initial state where the memory cell is recently configured as a set or reset cell via a programming or write operation. For example, a read operation to determine the state of the memory cell and thus the data represented by the state of the memory can cause a drift of the threshold of the memory cell and thus a drift of the state of the memory cell. Some details and examples of such drift can be found in U.S. Pat. App. Pub. No. 2019/0206506, entitled "Drift Mitigation with Embedded Refresh."

Prior to the application a programming pulse to configure a memory cell as a set cell or a reset cell, it is in generally desirable to apply a drift cancellation pulse from the opposite polarity of the programming pulse to cancel the drift of the state of the memory cell (e.g., drifting away from its previously programmed state of threshold). The drift cancellation operation can make it easier to snap the memory cell under the programming pulse and thus select the memory cell from a memory cell array for programming.

However, since the drift cancellation pulse is applied in the opposite polarity of the programming pulse, there is a polarity transition from the drift cancellation pulse to the programming pulse. The polarity transition consumes a significant amount of energy.

At least some aspects of the present disclosure address the above and other deficiencies by selectively applying the drift cancellation pulse, based on attributes about the memory cell to be programmed.

When a voltage pulse is applied across a memory cell, the memory cell can snap, snapping/jumping/changing rapidly from the state of allowing a small leak current (e.g., a non-conductive state) to pass through to the state of allowing a current higher than a threshold to pass through (e.g., a conductive state). The voltage applied on the memory cell immediately before the snapping is the threshold of the memory cell. After the snapping, the voltage across the memory cell drops significantly under the threshold but remain in the conductive state if the voltage pulse is still being driven onto the memory cell.

To set or reset the memory cell, a programming pulse is applied on the memory cell such that the memory cell snaps and thus is selected for programming. The remaining portion of the programming pulse is configured to push the threshold of the memory cell to a set state or a reset state. To set the memory cell, the programming pulse is applied in one polarity; and to reset the memory cell, the programming pulse is applied in the opposite polarity.

Some memory cells in an integrated circuit device can have drifts such that without the drift cancellation pulse, the thresholds of memory cells are too high for the memory cells to snap under the programming pulse. If a memory cell fails to snap during the programming pulse, the programming pulse can fail to place the memory cell in a state representing the data to be stored in the memory cell (e.g., the set state or the reset state).

However, other memory cells in the integrated circuit device may not have sufficient drifts to prevent snapping under the programming pulse. Thus, skipping the drift cancellation operation for such memory cells can significantly reduce the energy consumption during the programming of the memory cells to store data.

A predictive model can be used to determine whether the drift cancellation operation can be skipped for the programming of a memory cell to a set or reset cell.

For example, the predictive model can be configured to identify memory cells that are likely to have drifts that can prevent snapping during the programming pulse. The prediction can be based on attributes of a memory cell to be programmed, such as a measure of the electrical distance between the memory cell and its voltage drivers, a time gap from the previously write/programming operation, a location/address of the memory cell, etc. For example, the predictive model can be established via correlating attributes of memory cells and their statuses as to whether they have been previously failed to snap during programming without drift cancellation. For example, the predictive model can be used to estimate, based on the attributes of a memory cell to be programmed, the probability of the memory cell failing to snap during programming without drift cancellation, or an indication of whether the probability is above a threshold. In some implementations, an empirical formula can be used (e.g., based on electrical distance to voltage drivers) to classify whether a memory cell is likely to fail to snap without drift cancellation. If so, the drift cancellation operation is performed; otherwise, the drift cancellation operation is skipped.

An integrated circuit memory device can have multiple decks of memory cells. Each deck has a layer of memory cells configured between two layers of wires (e.g., bitlines and wordlines). The identification of the deck in which a memory cell is located can be used in the prediction of whether the drift cancellation operation is to be skipped for the programming of the memory cell.

For example, groups of memory cells can be assigned to bins according to their write cycle timing. The write cycle timing attributes of the bins/groups can be used in the prediction of whether the drift cancellation operation is to be skipped for the programming of the memory cell.

FIG. 1 shows a memory device configured with a drift predictor according to one embodiment.

In FIG. 1, the memory device includes an array 133 of memory cells, such as a memory cell 101.

The memory device of FIG. 1 includes a controller 131 that operates bitline drivers 137 and wordline drivers 135 to access the individual memory cells (e.g., 101) in the array 133.

Figure 2:
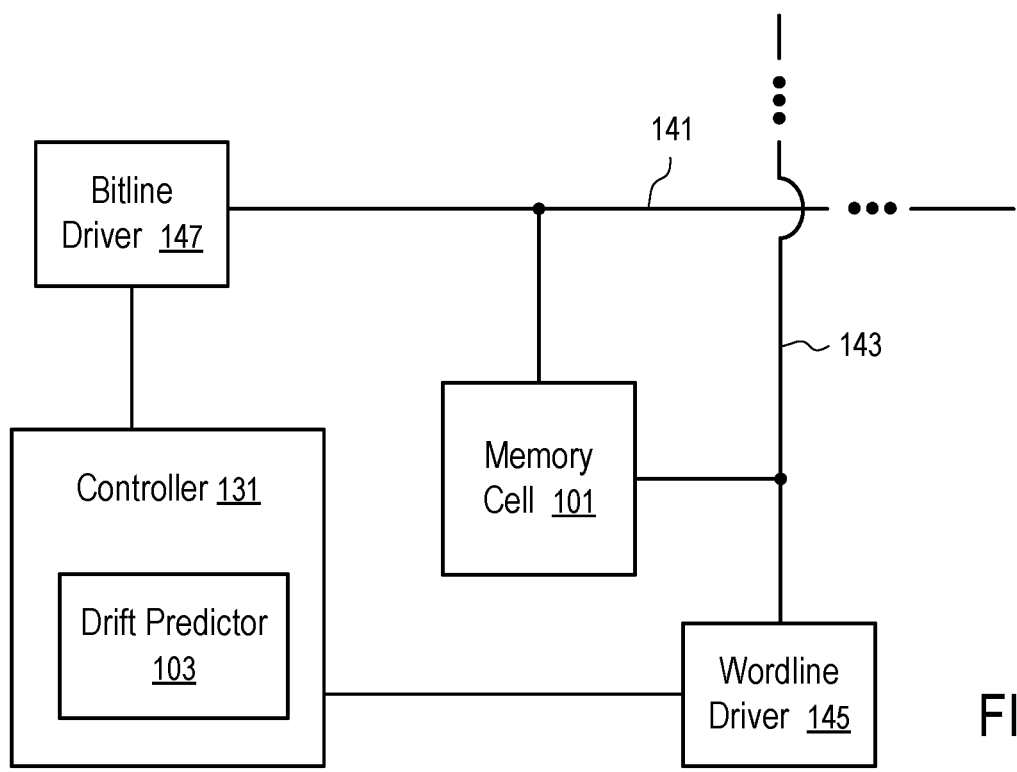
FIG. 2 shows a memory cell with a bitline driver and a wordline driver configured to apply voltage pulses according to one embodiment.

For example, each memory cell (e.g., 101) in the array 133 can be accessed via voltages driven by a pair of a bitline driver 147 and a wordline driver 145, as illustrated in FIG. 2.

The controller 131 includes a drift predictor 103. For example, the drift predictor 103 can be implemented via logic circuits and/or microcode/instructions to determine, based on the attributes of the memory cell 101, whether the state drift of the memory cell 101 is above a level such that a drift cancellation operation is required in programming the state of the memory cell 101 to represent a bit of data being written into the memory cell 101.

For example, the attributes of the memory cell 101 used in the prediction/determination can include the electrical distance of the memory cell 101 to its voltage drivers, the identification of a deck in which the memory cell 101 is located, a location or address of the memory cell 101 in the memory device, a write timing parameter or its range of the memory cell 101, etc.

FIG. 2 shows a memory cell 101 with a bitline driver 147 and a wordline driver 145 configured to apply voltage pulses according to one embodiment. For example, the memory cell 101 can be a typical memory cell 101 in the memory cell array 133 of FIG. 1.

The bitline driver 147 and the wordline driver 145 of FIG. 2 can drive voltages on the bitline 141 and the wordline 143 respectively relative to ground. In a drift cancellation operation, the bitline driver 147 and the wordline driver 145 are controlled by the drift predictor 103 of the controller 131 to selectively apply a drift cancellation pulse for the programming of the memory cell 101 to store data.

The bitline driver 147 and the wordline driver 145 can apply voltages of different polarities on the memory cell 101.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage relative to the ground on the bitline 141; and the wordline driver 145 drives a positive voltage relative to the ground on the wordline 143.

The memory cell 101 is in both the row connected to the bitline 141 and the column connected to the wordline 143. Thus, the memory cell 101 is subjected to the voltage difference between the voltage driven by the bitline driver 147 on the bitline 141 and the voltage driven by the wordline driver 145 on the wordline 143. The voltage difference represents a voltage pulse being driven onto the memory cell 101.

In general, when the voltage driven by the bitline driver 147 is higher than the voltage driven by the wordline driver 145, the memory cell 101 is subjected to a voltage in one polarity (e.g., positive polarity); and when the voltage driven by the bitline driver 147 is lower than the voltage driven by the wordline driver 145, the memory cell 101 is subjected to a voltage in the opposite polarity (e.g., negative polarity).

To program the memory cell 101 into a reset cell, the bitline driver 147 and the wordline driver 145 can drive a programming pulse of voltage onto the memory cell 101 in one polarity (e.g., positive polarity) to snap the memory cell 101 such that the memory cell 101 is in a conductive state. While the memory cell 101 is conductive, the bitline driver 147 and the wordline driver 145 continue driving the programming pulse to reduce the threshold voltage of the memory cell 101 in the positive polarity to a level designed for a reset cell. Reducing the threshold voltage of the memory cell 101 in the positive polarity increases the threshold voltage of the memory cell 101 in the negative polarity.

Similar, to program the memory cell 101 into a set cell, the bitline driver 147 and the wordline driver 145 can drive a programming pulse of voltage onto the memory cell 101 in the opposite polarity (e.g., negative polarity) to snap the memory cell 101 such that the memory cell 101 is a conductive state. While the memory cell 101 is conductive in the opposite polarity, the bitline driver 147 and the wordline driver 145 continue driving the programming pulse to reduce the threshold voltage of the memory cell 101 in the negative polarity to a level designed for a set cell. Reducing the threshold voltage of the memory cell 101 in the negative polarity increases the threshold voltage of the memory cell 101 in the positive polarity.

Thus, the programming pulses applied in different polarities can create a threshold window in a given polarity, which can be relied up to read the state of the memory cell 101 and thus determine whether the memory cell 101 is a set cell or a reset cell.

For example, after the memory cell 101 is programmed into a reset cell via a programming pulse in the positive polarity, the threshold voltage of the memory cell 101 under the positive polarity becomes low; and the threshold voltage of the memory cell 101 under the negative polarity becomes high. In contrast, after the memory cell 101 is programmed into a set cell via a programming pulse in the negative polarity, the threshold voltage of the memory cell 101 under the negative polarity becomes low; and the threshold voltage of the memory cell 101 under the positive polarity becomes high. As a result, when checked/read in the negative polarity, the memory cell 101 programmed into a reset cell has a higher threshold voltage than being programmed into a set cell. Similarly, when checked/read in the positive polarity, the memory cell 101 programmed into a set cell has a higher threshold voltage than being programmed into a reset cell.

Thus, when reading the memory cell 101 in the negative polarity, if a read voltage pulse snaps the memory cell 101 in the negative polarity, the memory cell 101 is a set cell; and if the read voltage fails to snap the memory cell 101 in the negative polarity, the memory cell 101 is a reset cell.

Similar, when reading the memory cell 101 in the positive polarity, if a read voltage snaps the memory cell 101 in the positive polarity, the memory cell 101 is a reset cell; and if the read voltage fails to snap the memory cell 101 in the positive polarity, the memory cell 101 is a set cell.

FIGS. 3-6 illustrate voltage profiles on a memory cell and currents passing through the memory cell during operations of drift cancellation and data programming according to one embodiment.

In FIGS. 3-6, the bitline voltage 205 relative to the ground is driven by the bitline driver 147 on the bitline 141 connected to the memory cell 101 during the application of a programming pulse. The wordline voltage 206 relative to the ground is driven by the wordline driver 145 on the wordline 143 connected to the memory cell 101 during the application of the programming pulse.

Figure 3:
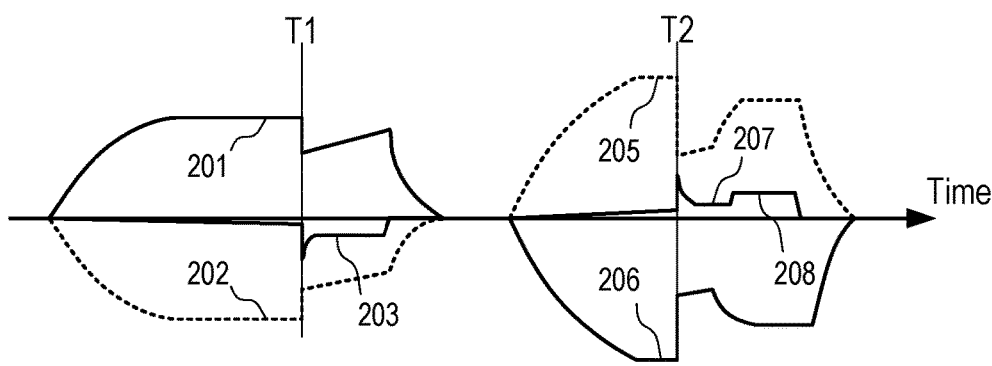
FIGS. 3-6 illustrate voltage profiles on a memory cell and currents passing through the memory cell during operations of drift cancellation and data programming according to one embodiment.
Figure 4:
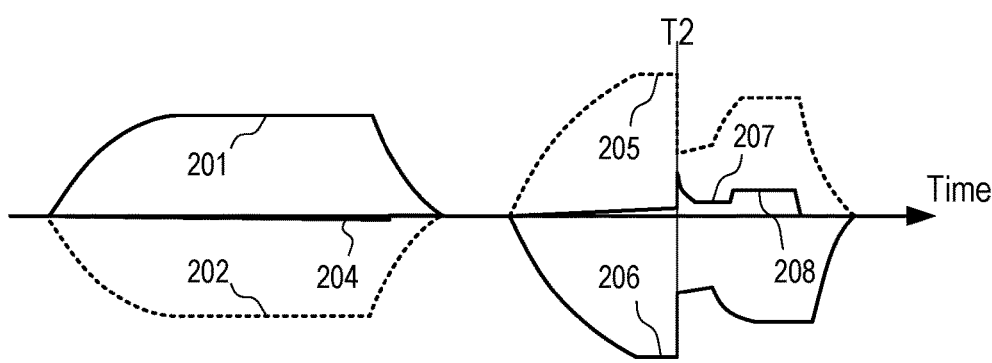

In each of FIGS. 3 and 4, the programming pulse is in a polarity (e.g., positive polarity), where the bitline voltage 205 is higher than the wordline voltage 206. As the bitline driver 147 and the wordline driver 145 drive up the magnitudes of the voltages on the bitline 141 and the wordline 143 in the positive polarity, the memory cell 101 snaps at time T2, such that the current passing through the memory cell 101 jumps from a small leak current to a selection current 207 that is above a threshold level for cell selection. Since the bitline voltage 205 is higher than the wordline voltage 206, the current going through the memory cell 101 is in a positive direction from the bitline 141 through the memory cell to the wordline 143. Snapping at time T2 during the programming pulse causes the magnitudes of the voltages on the wordline 143 and the bitline 141 to drop. After time T2, the bitline driver 147 and the wordline driver 145 continue driving up the magnitudes of the voltages on the wordline 143 and the bitline 141 in the positive polarity to cause a programming current 208 that is larger than the selection current 207. After the bitline driver 147 and the wordline driver 145 stop driving the programming pulse, the magnitudes of the voltages on the bitline 141 and the wordline 143 drop to zero over a period of time; and the current passing through the memory cell 101 also reduces to zero (and the memory cell 101 returns to the non-conductive state). After the programming pulse, the memory cell 101 is in a reset state, having a high threshold voltage in negative polarity and a low threshold voltage in positive polarity.

Figure 5:
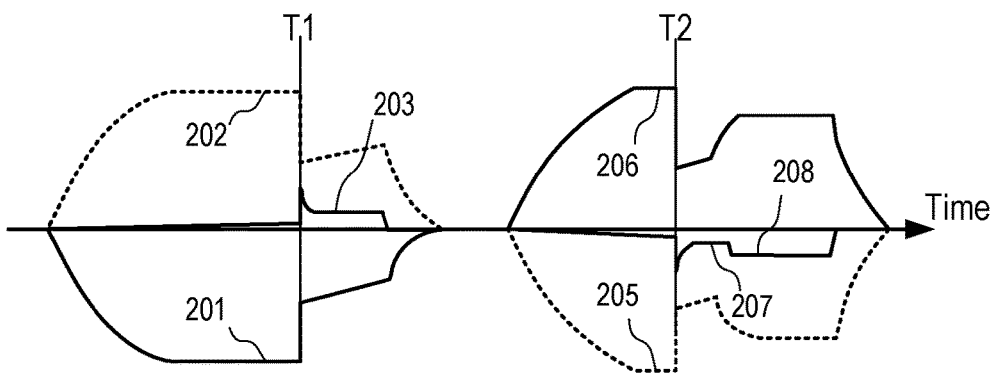
Figure 6:
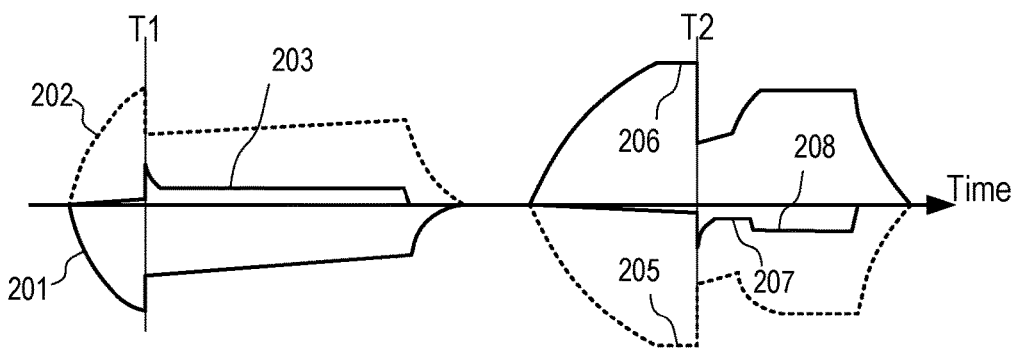

In contrast, the programming pulse illustrated in each of FIGS. 5 and 6 is in the opposite polarity (e.g., negative polarity), where the bitline voltage 205 is lower than the wordline voltage 206. As the bitline driver 147 and the wordline driver 145 drive up the magnitudes of the voltages on the bitline 141 and the wordline 143 in the negative polarity, the memory cell 101 snaps at time T2, such that the current passing through the memory cell 101 jumps from a small leak current to a selection current 207 that is above a threshold level for cell selection. Since the bitline voltage 205 is lower than the wordline voltage 206, the current going through the memory cell 101 is in a negative direction from the wordline 143 through the memory cell to the bitline 141. Snapping at time T2 during the programming pulse causes the magnitudes of the voltages on the wordline 143 and the bitline 141 to drop. After time T2, the bitline driver 147 and the wordline driver 145 continue driving up the magnitudes of the voltages on the wordline 143 and the bitline 141 in the negative polarity to cause a programming current 208 that is larger in magnitude than the selection current 207. After the bitline driver 147 and the wordline driver 145 stop driving the programming pulse, the magnitudes of the voltages on the bitline 141 and the wordline 143 drop to zero relative to ground; and the current passing through the memory cell 101 also reduces to zero. After the programming pulse, the memory cell 101 is in a set state, having a high threshold voltage in positive polarity and a low threshold voltage in negative polarity.

After the memory cell 101 is freshly programmed to have a set state or a reset state, the memory cell 101 can snap (e.g., at time T2) when the bitline driver 147 and the wordline driver 145 drive up the magnitudes of the voltages on the bitline 141 and the wordline 143 in applying a programming pulse in either the positive polarity or the negative polarity. In driving the programming pulse, the bitline driver 147 and the wordline driver 145 are configured to drive up the magnitudes of the voltages on the bitline 141 and the wordline 143 toward a predefined level (e.g., 3.5 V for a voltage difference across the memory cell 101 towards 7 V).

However, after a period of time and when the memory cell 101 is to be programmed again, the state of the memory cell 101 may have drifted away from the freshly programmed states such that the memory cell 101 can fail to snap during the programming pulse.

To eliminate the drift that can prevent the memory cell 101 from snapping during the programming pulse, a drift cancellation pulse can be applied in the opposite polarity of the programming pulse, as illustrated in FIGS. 3 to 6.

For example, in FIGS. 3 and 4, the programming pulse is in the positive polarity, where the bitline voltage 205 is higher than the wordline voltage 206. A drift cancellation pulse having the bitline voltage 202 and the wordline voltage 201 is applied in the negative polarity, where the bitline voltage 202 is lower than the wordline voltage 201. In driving the drift cancellation pulse in the negative polarity, the bitline driver 147 and the wordline driver 145 are configured to drive up the magnitudes of the voltages on the bitline 141 and the wordline 143 toward a reduced pre-defined level (e.g., 2.5 V for a voltage difference across the memory cell 101 towards 5 V) that is lower than the predefined level (e.g., 3.5 V) for the programming pulse.

FIG. 3 illustrates an example where the drift cancellation pulse is applied on the memory cell 101 that has been previously programmed into a set state having a low threshold in the negative polarity. The drift cancellation pulse applied in the negative polarity causes the memory cell 101 to snap at time T1. Similar to the snapping at time T2 during a programming pulse, the snapping of the memory cell 101 at time T1 in FIG. 3 allows a selection current 203 to go through the memory cell 101, which can be sensed optionally to determine that the memory cell 101 is a set cell. The snapping of the memory cell 101 at time T1 during the drift cancellation pulse also have the benefit of clearing a possible drift in the memory cell 101 such that the memory cell 101 will snap at time T2 when a programming pulse is applied after the drift cancellation pulse.

Figure 7:
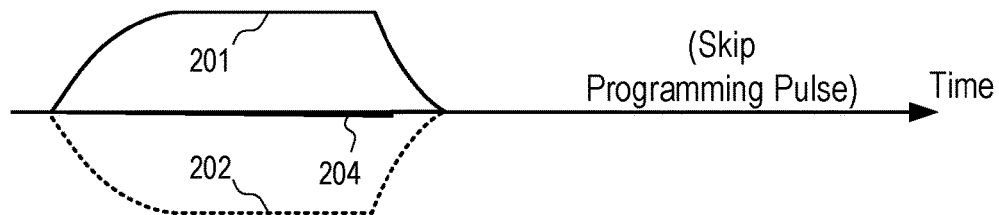
FIGS. 7-9 illustrate some techniques to avoid polarity transitions in programming a memory cell according to some embodiments.

FIG. 4 illustrates an example where the drift cancellation pulse is applied on the memory cell 101 that has been previously programmed into a reset state having a high threshold in the negative polarity. Thus, the memory cell 101 does not snap during the drift cancellation pulse that is applied in the negative polarity and that has a reduced magnitude compared to the programming pulse. Only a small leak current 204 can go through the memory cell 101 during the drift cancellation pulse. The lack of the selection current 203 can be sensed optionally to determine that the memory cell 101 is a reset cell. Since the memory cell 101 is already in a reset state, the subsequent programming pulse to place the memory cell in a rest state can be optionally skipped, as illustrated in FIG. 7. Skipping the programming pulse avoids a potential polarity transition between a drift cancellation pulse and a programming pulse.

In FIGS. 5 and 6, the programming pulse is in the negative polarity, where the bitline voltage 205 is lower than the wordline voltage 206. A drift cancellation pulse having the bitline voltage 202 and the wordline voltage 201 is applied in the positive polarity, where the bitline voltage 202 is higher than the wordline voltage 201. In driving the drift cancellation pulse in the positive polarity, the bitline driver 147 and the wordline driver 145 are configured to drive up the magnitudes of the voltages on the bitline 141 and the wordline 143 relative to the ground toward a predefined level (e.g., 3.5 V) that is the same as (or close to) the predefined level (e.g., 3.5 V) for the programming pulse.

FIG. 5 illustrates an example where the drift cancellation pulse is applied on the memory cell 101 that has been previously programmed into a set state having a high threshold in the positive polarity. The drift cancellation pulse applied in the positive polarity causes the memory cell 101 to snap at time T1 in FIG. 5. Similar to the snapping at time T2 during a programming pulse, the snapping of the memory cell 101 at time T1 allows a selection current 203 to go through the memory cell 101. The snapping of the memory cell 101 at time T1 during the drift cancellation pulse also have the benefit of clearing a possible drift in the memory cell 101 such that the memory cell 101 will snap at time T2 when a programming pulse is applied after the drift cancellation pulse.

FIG. 6 illustrates an example where the drift cancellation pulse is applied on the memory cell 101 that has been previously programmed into a reset state having a low threshold in the positive polarity. Thus, the memory cell 101 snaps at time T1 in FIG. 6 during the drift cancellation pulse applied in the positive polarity. The snapping of the memory cell 101 at time T1 during the drift cancellation pulse also have the benefit of clearing a possible drift in the memory cell 101 such that the memory cell 101 will snap at time T2 when a programming pulse is applied after the drift cancellation pulse.

Since the drift cancellation pulse is applied in the opposite polarity of the polarity of the subsequent programming pulse, a large amount of energy is dissipated during the polarity transition.

When the drift predictor 103 determines that the memory cell 101 has a drift that can prevent snapping during a programming pulse, the controller 131 can use the bitline driver 147 and the wordline driver 145 to apply a drift cancellation pulse before the programming pulse, as illustrated in FIGS. 3 to 6. Otherwise, the controller 131 can skip instructing the bitline driver 147 and the wordline driver 145 to apply a drift cancellation pulse before the programming pulse. The elimination of the drift cancellation pulse in at least some instances can lead to the reduction of energy consumption of the memory device having the memory cell array 133.

In some implementations, the determination of whether to skip the drift cancellation pulse is performed specifically for the application of the programming pulse in the negative polarity (e.g., as in FIGS. 5 and 6) to program the memory cell 101 into a set cell (e.g., not performed for the programming pulse in the positive polarity).

Figure 8:
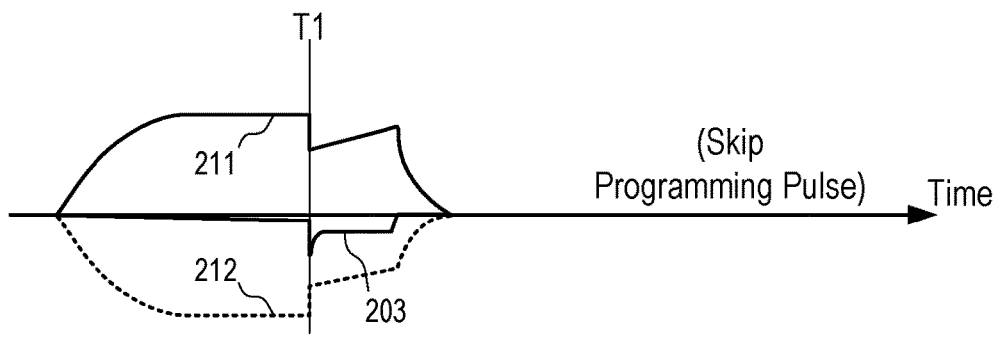
Figure 9:
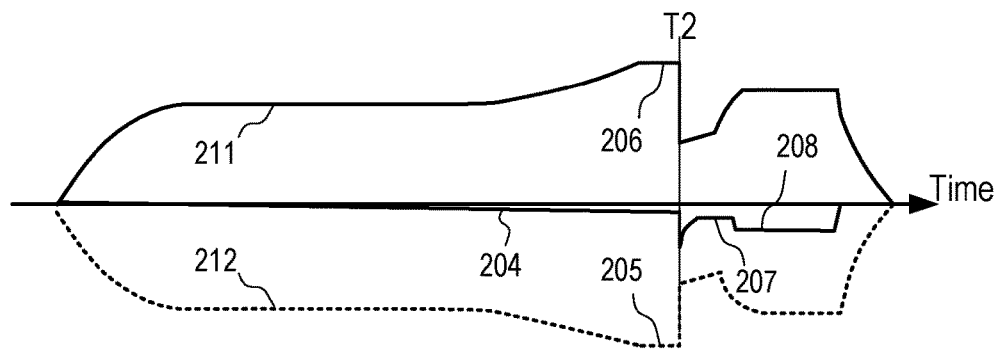

In some implementations, when the drift predictor 103 determines that the drift cancellation pulse in FIGS. 5 and 6 can be skipped, the controller 131 can optionally apply a read pulse that is in the same polarity as the programming pulse. The result of the read pulse can be used to decide whether to skip the subsequent programming pulse, as illustrated in FIGS. 8 and 9. In FIGS. 8 and 9, the read pulse includes a wordline voltage 211 and a bitline voltage 212 that are applied in the same, negative polarity of a programming pulse to be applied to place the memory cell 101 into a set state. When driving the read pulse, the bitline driver 147 drives the bitline voltage 212 on the bitline 141 towards a predetermine magnitude (e.g., 2.5 V) that is lower than the magnitude for the programming pulse (e.g., 3.5 V); and similarly, the wordline driver 145 drives the wordline voltage 211 on the bitline 141 towards the predetermined magnitude (e.g., 2.5 V) that is lower than the corresponding magnitude for the programming pulse (e.g., 3.5 V).

FIG. 8 illustrates an example where the read pulse is applied on the memory cell 101 that has been previously programmed into a set state, where the memory cell 101 has a low threshold in the negative polarity. Thus, the memory cell 101 snaps at time T1 to allow a selection current 203 to go through the memory cell 101. The detection of the selection current 203 indicates that the memory cell 101 is already in the set state; and thus, the controller 131 can decide to skip the subsequent programming pulse (e.g., the programming pulse illustrated in FIG. 5).

FIG. 9 illustrates an example where the read pulse is applied on the memory cell 101 that has been previously programmed into a reset state, where the memory cell 101 has a high threshold in the negative polarity. The memory cell 101 does not snap during the read pulse. Only a small leak current 204 goes through the memory cell 101. The detection of the lack of a selection current 203 indicates that the memory cell 101 is currently in the reset state; and thus, the controller 131 can instruct the bitline driver 147 and the wordline driver 145 to apply the programming pulse in the negative polarity to place the memory cell 101 into the set state. Optionally, in response to a determination that the memory cell 101 is currently in the reset state, the controller 131 instructs the bitline driver 147 and the wordline driver 145 to transition into driving the programming pulse without stopping driving the bitline 141 and the wordline 143 for the period of time between the read pulse and the programming pulse. As a result, the magnitudes of the bitline voltage 212 and the wordline voltage 211 do not decrease prior to the driving of the programming pulse, as illustrated in FIG. 9; and the read pulse and the programming pulse are combined to reduce voltage swing for the programming of the memory cell 101, which can reduce energy consumption. Alternatively, the controller 131 can allow the bitline driver 147 and the wordline driver 145 to stop driving voltages on the bitline voltage 212 and the wordline voltage 211 for a period of time between the read pulse and the programming pulse.

Figure 10:
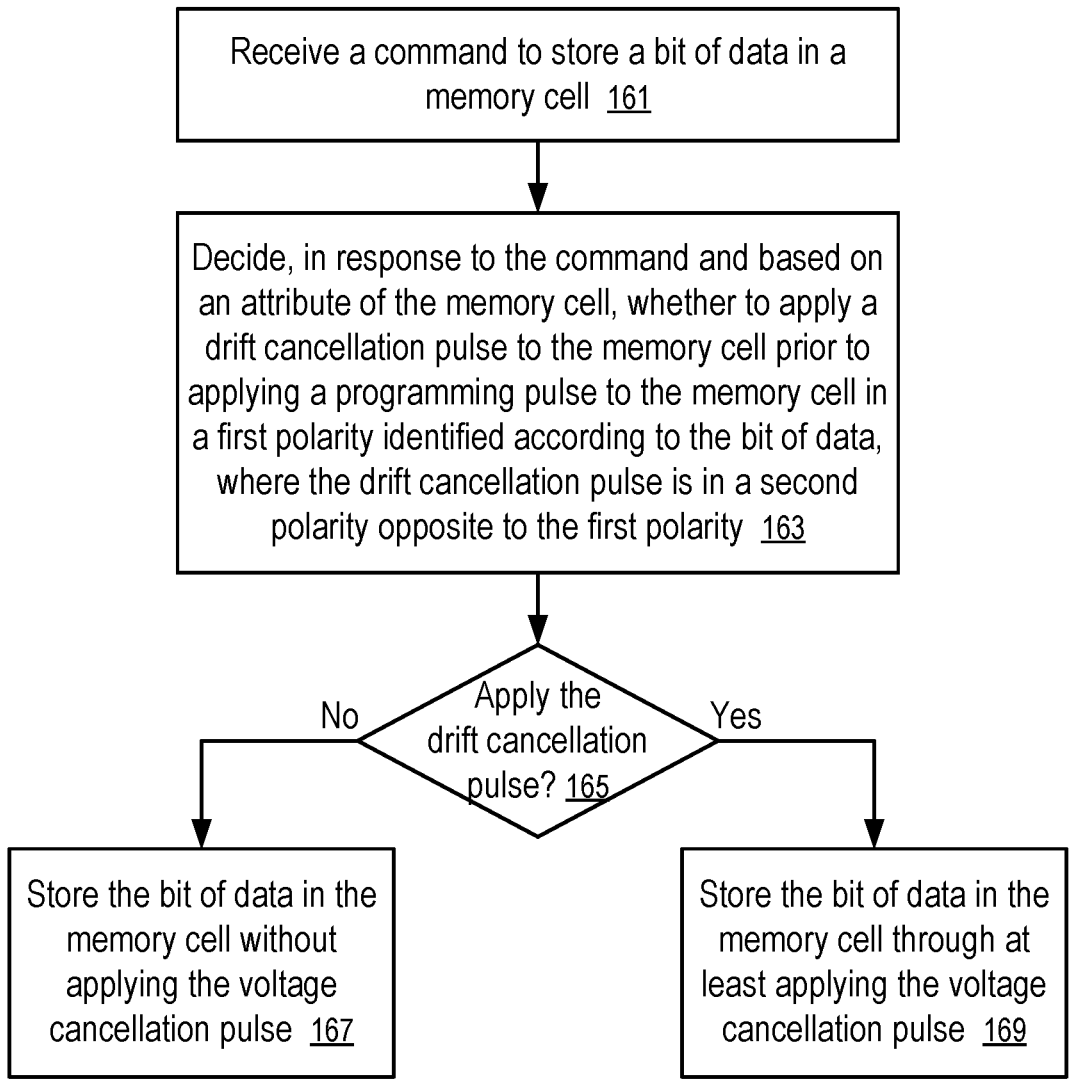
FIG. 10 shows a method to program a memory cell according to one embodiment.

FIG. 10 shows a method to program a memory cell according to one embodiment. For example, the method of FIG. 10 can be implemented in a memory device of FIG. 1 using a drift predictor discussed above in connection with FIGS. 1 to 9.

At block 161, a controller 131 receives a command to store a bit of data in a memory cell 101.

At block 163, the controller 131 decides, in response to the command and based on an attribute of the memory cell 101, whether to apply a drift cancellation pulse to the memory cell 101 prior to applying a programming pulse to the memory cell 101 in a first polarity identified according to the bit of data, where the drift cancellation pulse is in a second polarity opposite to the first polarity.

For example, the controller 131 can include a drift predictor 103 configured to predict or classify, based on the attribute of the memory cell 101, whether the memory cell 101 has a drift, in a current state of the memory cell, that is sufficient to prevent the memory cell 101 from snapping and thus from being selected during application of the programming pulse. If the drift is predicted/classified to be sufficient to prevent the memory cell 101 from snapping during the programming pulse, the drift cancellation pulse is applied; otherwise, the drift cancellation pulse is skipped and optionally replaced with a read pulse in the same polarity of the programming pulse (e.g., as illustrated in and discussed with FIGS. 8 and 9).

For example, the attribute of the memory cell 101 used in the prediction can be is based at least in part on a location or address of the memory cell 101 in the memory device (e.g., an identification of deck, row and column), an electrical distance from the memory cell 101 to its voltage drivers (bitline driver 147 and the wordline driver 145), or a timing of a prior command to store data into the memory cell 101, or any combination thereof.

If a result at block 165 indicates to apply the drift cancellation pulse, at block 167 the controller 131 is configured to perform operations to store the bit of data in the memory cell 101 without applying the voltage cancellation pulse. Otherwise, at block 169, the controller 131 is configured to perform operations to Store the bit of data in the memory cell 101 through at least applying the voltage cancellation pulse.

For example, as illustrated in FIG. 2, the memory cell 101 is coupled between two voltage drivers: a bitline driver 147 and a wordline driver 145. A voltage pulse applied by the two voltage drivers is in the first polarity when a current (e.g., leak current 204) going through the memory cell is in a first direction, but in the second polarity when a current (e.g., leak current 204) going through the memory cell is in a second direction opposite to the first direction.

For example, the first polarity and the second polarity can be different ones of positive polarity and negative polarity. For example, in driving positive polarity, the bitline driver 147 drives up the magnitude of a positive voltage on the bitline 141 relative to the ground; and the wordline driver 145 drives up the magnitude of a negative voltage on the wordline 143 relative to the ground. In contrast, in driving negative polarity, the bitline driver 147 drives up the magnitude of a negative voltage on the bitline 141 relative to the ground; and the wordline driver 145 drives up the magnitude of a positive voltage on the wordline 143 relative to the ground.

As illustrated in FIGS. 8 and 9, when the drift cancellation pulse is canceled, the two voltage drivers (e.g., the bitline driver 147 and the wordline driver 145) can drive a read pulse in the first polarity (same as the polarity of the programming pulse selected based on the bit of data to be stored). During the read pulse, a current sensor is configured to evaluate the magnitude of a current going through the memory cell 101. If the magnitude is greater than a threshold, the memory cell 101 has snapped during the read pulse, which can cause the controller 131 to skip the application of the programming pulse (because the memory cell 101 is already having the state representative the data to be stored). Otherwise, the controller 131 can instruct the two voltage drivers (e.g., the bitline driver 147 and the wordline driver 145) to combine the read pulse and the subsequent programming pulse.

In some implementations, the selective application of the drift cancellation pulse is performed only for the programming pulse to store a specific bit of data in the memory cell 101 (e.g., the programming pulse of FIGS. 5 and 6) where the cancellation pulse has a magnitude equal to (or similar to) the programming pulse. Thus, the determining of whether to apply the programming pulse is in response to storing the specific bit of data in the memory cell 101. For example, when the command is received to store another bit of data in the memory cell 101, the operation of block 163 can be skipped; and the drift cancellation pulse can be applied as illustrated in FIGS. 3 and 4 (or 7) without examining the attributes of the memory cell 101 to be programmed.

In one implementation, to apply the read pulse, the bitline driver 147 and the wordline driver 145 are configured to drive the voltage difference across the memory cell 101 towards a first predefined magnitude (e.g., 5 V). To apply the programming pulse, the bitline driver 147 and the wordline driver 145 are configured to drive the voltage difference across the memory cell 101 towards a second predefined magnitude (e.g., 7 V). Since the read pulse and the programming pulse are in the same polarity, the bitline driver 147 and the wordline driver 145 can be instructed to switch from driving the first predefined magnitude (e.g., 5 V) to driving the second predefined magnitude (e.g., 7 V) without stopping. As a result, the voltage difference across the memory cell 101 continues to increase in magnitude until the memory cell 101 snaps in the programming pulse, as illustrated in FIG. 9.

The controller 131 can be configured in an integrated circuit having a plurality of decks of memory cells. Each deck can be sandwiched between a layer of bitlines, a layer of wordlines; and the memory cells in the deck can be arranged in an array. Adjacent decks of memory cells may share a layer of bitlines or a layer of wordlines. Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers are connected to bitlines in the decks; and wordline drivers are connected to wordlines in the decks. Thus, a typical memory cell 101 is connected to a bitline driver 147 and a wordline driver 145.

For example, the memory cell 101 has a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

The memory device of FIG. 1 can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method, comprising:
receiving a command to store a bit of data in a memory cell;
deciding, in response to the command and based on an attribute of the memory cell, whether to apply a drift cancellation pulse to the memory cell prior to applying a programming pulse to the memory cell in a first polarity identified according to the bit of data, wherein the drift cancellation pulse is in a second polarity that is opposite to the first polarity; and
programming the memory cell to store the bit of data according to a result of the deciding, wherein the programming comprises:
skipping the drift cancellation pulse in response to the result being a first option; or
applying the drift cancellation pulse in response to the result being a second option.

2. The method of claim 1, wherein the memory cell is coupled between two voltage drivers; the first polarity causes a current to go through the memory cell in a first direction; and the second polarity causes a current to go through the memory cell in a second direction that is opposite to the first direction; and the method further comprises:

instructing the two voltage drivers to drive a read pulse in the first polarity in response to the result being the first option; and determining whether a current going through the memory cell during the read pulse has a magnitude larger than a threshold.

3. The method of claim 2, further comprising:
skipping the programming pulse in response to the magnitude of the current going through the memory cell during the read pulse exceeds the threshold.

4. The method of claim 2, wherein the voltage drivers are configured to drive the read pulse towards a first predefined magnitude and drive the programming pulse towards a second predefined magnitude larger than the first predefined magnitude; and the method further comprises:

instructing voltage drivers to switch from driving towards the first predefined magnitude to driving towards the second predefined magnitude without stopping to combine the read pulse and the programming pulse.

5. The method of claim 2, wherein the attribute is based at least in part on a location of the memory cell, an address of the memory cell, an electrical distance from the memory cell to the two voltage drivers, or a timing of a command to store data into the memory cell, or any combination thereof.

6. A device, comprising:
a plurality of memory cells;
a plurality of voltage drivers, including a first voltage driver connected to a respective memory cell in the plurality of memory cells and a second voltage driver connected to the memory cell, wherein the memory cell is configurable to be in a first state via the first voltage driver and the second voltage driver driving a first voltage pulse on the memory cell in a first polarity in which a voltage driven by the first voltage driver is higher than a voltage driven by the second voltage driver; and
a controller connected to the plurality of voltage drivers, wherein, in response to a command to configure the memory cell to have the first state representative of storing first data in the memory cell, the controller is configured to determine, based on an attribute of the memory cell, whether to apply a second voltage pulse on the memory cell in a second polarity, opposite to the first polarity; and wherein a voltage driven by the first voltage driver is lower than a voltage driven by the second voltage driver in the second polarity.

7. The device of claim 6, wherein the attribute of the memory cell is based at least in part on a location of the memory cell in the device.

8. The device of claim 6, wherein the attribute of the memory cell is based at least in part on an address of the memory cell in the device.

9. The device of claim 6, wherein the attribute of the memory cell is based at least in part on an indicator of an electrical distance from the memory cell to the first voltage driver and the second voltage driver.

10. The device of claim 6, wherein the attribute of the memory cell is based on a time range within which the memory cell is previously applied a voltage pulse to store data.

11. The device of claim 6, wherein responsive to the first state being a pre-selected state, the controller is further configured to determine whether to apply the second voltage pulse.

12. The device of claim 11, wherein responsive to the first state being an alternative state different from the pre-selected state, the controller instructs the first voltage driver and the second voltage driver to apply the second voltage pulse without determining, based on the attribute, whether to apply the second voltage pulse.

13. The device of claim 12, wherein in the first polarity, the first voltage driver is configured to drive a positive voltage relative to ground, and the second voltage driver configured to drive a negative voltage relative to the ground; in the second polarity, the first voltage driver is configured to drive a negative voltage relative to the ground, and the second voltage driver configured to drive a positive voltage relative to the ground; in driving the first voltage pulse, the first voltage driver and the second voltage driver are configured to drive voltages up to a first predetermined magnitude; and in driving the second voltage pulse when the first state is the pre-selected state, the first voltage driver and the second voltage driver are configured to drive voltages up to the first predetermined magnitude.

14. The device of claim 13, wherein in response to a determination to skip the second voltage pulse, the controller is further configured to instruct the first voltage driver and the second voltage driver a third voltage pulse in the first polarity and determine whether a current above a threshold goes through the memory cell during the third voltage pulse.

15. The device of claim 14, wherein response to the current being above the threshold during the third voltage pulse, the device is configured to skip the first voltage pulse following the third voltage pulse.

16. The device of claim 14, wherein in driving the third voltage pulse, the first voltage driver and the second voltage driver are configured to drive voltages up to a second predetermined magnitude that is lower than the first predetermined magnitude; and response to the current being below the threshold during the third voltage pulse, the controller is further configured to instruct the first voltage driver and the second voltage driver to change from driving voltages up to the second predetermined magnitude to driving voltages up to the first predetermined magnitude without stopping driving voltages.

17. An integrated circuit, comprising:
a plurality of layers of bitlines;
a plurality of layers of wordlines;
a plurality of decks of memory cells configured in an array, each of the decks being between a layer of bitlines among the plurality of layers of bitlines and a layer of wordlines among the plurality of layers of wordlines, each of the layer of bitlines connected to a row of memory cells in the array, and each of the layer of wordlines connected to a column of memory cells in the array;
bitline drivers connected to the plurality of layers of bitlines;
wordline drivers connected to the plurality of layers of wordlines, wherein each respective memory cell in the decks is connected to a bitline driver and a wordline driver, wherein the bitline driver and the wordline driver are configured to apply a voltage in a positive polarity when a voltage driven by the bitline driver is higher than a voltage driven by the wordline driver, and a negative polarity when a voltage driven by the bitline driver is lower than a voltage driven by the wordline driver; and
a controller having a drift predictor configured to predict, based on an attribute of the memory cell, whether the memory cell has a drift, in a current state of the memory cell, that is sufficient to prevent the memory cell from being selected during application of a programming pulse by the bitline driver and the wordline driver in a first polarity identified by a bit of data to be stored in the memory cell;

wherein in response to the drift predictor determines that the drift is sufficient to prevent the memory cell from being selected during the programming pulse, the controller is configured to instruct the bitline driver and the wordline driver to apply a drift cancellation pulse in a second polarity opposite to the first polarity, prior to the application of the programming pulse in the first polarity.

18. The integrated circuit of claim 17, wherein the attribute is based at least in part on an identification of a deck in which the memory cell is configured, an electrical distance from the memory cell to the bitline driver and the wordline driver, or a time of a previous write operation performed for the memory cell, or any combination thereof.

19. The integrated circuit of claim 18, wherein the memory cell has an element acting both as a selector device and a memory device.

20. The integrated circuit of claim 19, wherein the memory cell is selected during the programming pulse when the programming pulse causes the memory cell to become conductive and allow more than a threshold amount of current to passing through the memory cell; and wherein in response to the drift predictor determines that the drift is insufficient to prevent the memory cell from being selected during the programming pulse, the bitline driver and the wordline driver are configured to skip application of the drift cancellation pulse in the second polarity opposite.

\* \* \* \* \*